(12) United States Patent
Vikram et al.

(10) Patent No.: US 6,770,513 B1
(45) Date of Patent: Aug. 3, 2004

(54) THERMALLY ENHANCED FLIP CHIP PACKAGING ARRANGEMENT

(75) Inventors: Seshadri Vikram, Fremont, CA (US); William J. Schaefer, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 257 days.

(21) Appl. No.: 09/668,031

(22) Filed: Sep. 21, 2000

Related U.S. Application Data

(60) Provisional application No. 60/172,368, filed on Dec. 16, 1999.

(51) Int. Cl.[7] .......................... H01L 21/44; H01L 21/48; H01L 21/50
(52) U.S. Cl. ........................................ 438/122; 257/707
(58) Field of Search ................................ 257/706, 707, 257/722, 710, 751; 438/122, 118

(56) References Cited

U.S. PATENT DOCUMENTS

| | | | | |
|---|---|---|---|---|
| 4,499,659 A | * | 2/1985 | Varteresian et al. | |
| 4,620,215 A | * | 10/1986 | Lee | |
| 5,533,256 A | * | 7/1996 | Call et al. | |
| 5,843,808 A | * | 12/1998 | Karnezos | |
| 5,903,437 A | * | 5/1999 | Pierson et al. | |
| 6,046,498 A | * | 4/2000 | Yoshikawa | |
| 6,046,907 A | * | 4/2000 | Yamaguchi | |
| 6,084,775 A | * | 7/2000 | Bartley et al. | |
| 6,091,603 A | * | 7/2000 | Daves et al. | |
| 6,111,322 A | * | 8/2000 | Ando et al. | |
| 6,262,489 B1 | * | 7/2001 | Koors et al. | |
| 6,275,381 B1 | * | 8/2001 | Edwards et al. | |
| 6,281,575 B1 | * | 8/2001 | Nishikawa et al. | |
| 6,292,369 B1 | * | 9/2001 | Daves et al. | |

\* cited by examiner

*Primary Examiner*—Sheila V. Clark
(74) *Attorney, Agent, or Firm*—Beyer Weaver & Thomas LLP

(57) ABSTRACT

An improved arrangement for attaching a heat sink to a flip chip type die is disclosed. More specifically, the heat sink is attached to the back surface of the flip chip die by a metallic solder material. Such an arrangement provides a good thermal conductivity between the die and the heat sink. In some embodiments, the die is mounted on a grid array type substrate in a flip chip arrangement such that the die contacts are coupled to adjacent I/O pads on the substrate. In another aspect, one or more metallic intermediate die attach layers are deposited over the back surface of the die to form a solderable die surface. The heat sink is then attached to the solderable die surface. This approach works well when the chosen solder does not adhere well to the semiconductor die material. In one preferred implementation the intermediate metallic layers include a barrier layer that is deposited over the back surface of the die and a solderable metallic layer that is deposited over the barrier layer. In a method aspect, the barrier and metallic layers may be deposited on the back side of a wafer during fabrication which provides the desired structure after dicing.

2 Claims, 2 Drawing Sheets

US 6,770,513 B1

THERMALLY ENHANCED FLIP CHIP PACKAGING ARRANGEMENT

CROSS REFERENCE TO RELATED APPLICATIONS

This patent application is a continuation-in-part of U.S. patent application Ser. No. 60/172,368, filed on Dec. 16, 1999, naming Seshadri Vikram and William J. Schaefer as inventors, and titled "THERMALLY ENHANCED FLIP CHIP PACKAGING ARRANGEMENT" which is incorporated herein by reference for all purposes and in its entirety.

BACKGROUND OF THE INVENTION

The present invention relates generally to semiconductor packaging. More particularly, a packaging arrangement that utilizes a metallic solder material to couple the back side of a flip chip device to a heat sink is described.

As semiconductor manufacturing techniques improve, the size of semiconductor devices tends to decrease and the density of components within such devices tends to increase. One drawback of such trends is that in more complex and/or high power devices they increase the need to manage the dissipation of the heat generated during operation. One conventional approach to heat management is to glue a metallic heat sink to the die. Most commonly the heat sinks are formed from anodized aluminum, although other materials are used as well. By way of example and referring to FIG. 1, in flip chip packaging it is common to use an epoxy adhesive 23 to couple a heat sink 20 to the back side of a flip chip die 25. Although such an arrangement works well in many circumstances, most epoxy adhesives have relatively low thermal conductivities. The low thermal conductivity of the epoxy adhesive thus becomes a significant limitation to the overall effectiveness of the heat sink.

Another conventional flip chip packaging arrangement is illustrated in FIG. 2. In this embodiment, a flip chip type die 45 is mounted on a ball or pin grid array substrate 48 in a conventional manner. A heat sink 50 having a ring foot 52 is then secured to the substrate 48. More specifically, the ring foot 52 portion of the heat sink is adhered to the substrate using an appropriate adhesive material such as epoxy. A thermal grease 54 is then typically used to improve the thermal contact between the die 45 and the heat sink 50. However, like the epoxy adhesives used to attach a heat sink directly to a die, conventional thermal greases used in semiconductor packaging applications tend to have relatively low thermal conductivities. Thus again, the relatively low thermal conductivity of the thermal grease becomes a significant limitation to the overall effectiveness of the heat sink.

Although the flip chip packaging arrangements described above work well in many applications, there is a continuing need for improved flip chip style packaging arrangements that facilitate better heat dissipation.

SUMMARY OF THE INVENTION

To achieve the foregoing and other objects and in accordance with the purpose of the present invention, an improved arrangement for attaching a heat sink to a flip chip type die is disclosed. More specifically, the heat sink is attached to the back surface of the flip chip die by a metallic solder material. Such an arrangement provides good thermal conductivity between the die and the heat sink. In some embodiments, the die is mounted on a grid array type substrate in a flip chip arrangement such that the die's contacts are coupled to adjacent I/O pads on the substrate.

In some embodiments, one or more metallic intermediate die attach layers are deposited over the back surface of the die to form a solderable die surface. The heat sink is then attached to the solderable die surface. This approach works well when the chosen solder does not adhere well to the semiconductor die material. In one preferred implementation the intermediate metallic layers include a barrier layer that is deposited over the back surface of the die and a solderable metallic layer that is deposited over the barrier layer. The barrier layer is typically used to prevent undesirable interactions between the solderable metallic layer and the semiconductor material and/or to improve adhesion of the solderable layer, to the semiconductor material. In a method aspect, the barrier and metallic layers may be deposited on the back side of a wafer during fabrication which provides the desired structure after dicing.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF THE INVENTION

An improved arrangement for attaching a heat sink to a flip chip type die is disclosed. More specifically, the heat sink is attached to the back surface of the flip chip die using a metallic solder material. Such an arrangement provides good thermal conductivity between the die and the heat sink since metallic solders almost universally have significantly better thermal conductivity then the epoxies and thermal greases conventionally used to couple the back side of a flip chip die to a heat sink.

Figure 1:
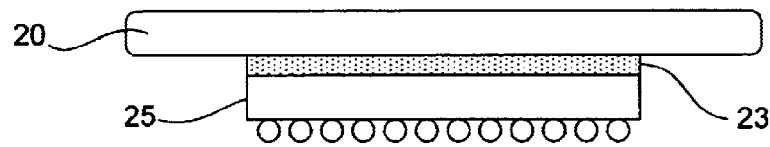
FIG. 1 is a diagrammatic side view of a first prior art packaging arrangement.
Figure 2:
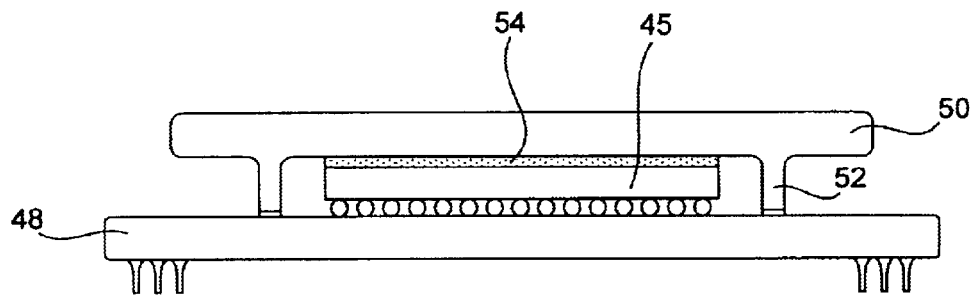
FIG. 2 is a diagrammatic side view of a second prior art packaging arrangement.
Figure 3:
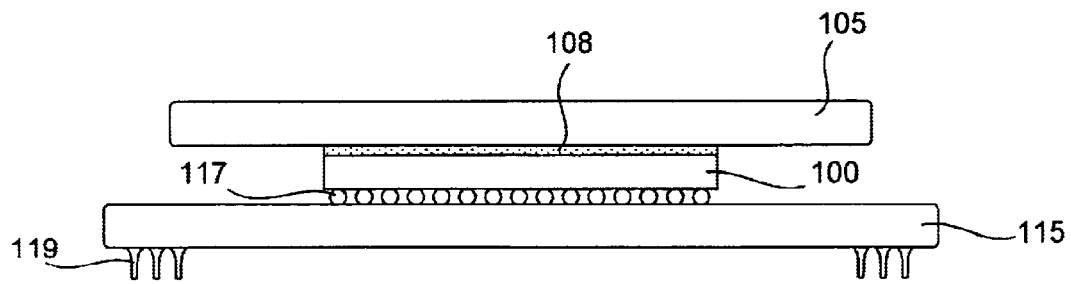
FIG. 3 is a diagrammatic side view of a packaging arrangement in accordance with one embodiment of the present invention.

Referring initially to FIG. 3, a representative flip chip packaging arrangement in accordance with one embodiment of the invention will be described. In the embodiment shown, a heat sink 105 is soldered to the back side of a flip chip type die 100 using a metal based solder material 108. A wide variety of solders may be used as the solder 108. By way of example lead-tin and tin-silver-chromium solders work well. The heat sink preferably includes a wettable surface to facilitate soldering. The advantage of the described structure is that the thermal conductivity of metallic solders are almost universally significantly higher then the thermal conductivities of the epoxies and thermal greases currently used to couple heat sinks to flip chip dice. By way of example, thermal conductivities of virtually any metal based solder are on the order of at least 50 watts/m-k as compared to thermal conductivities in the range of 2–5 watts/m-k which are common in epoxies and thermal greases that are currently available to the semiconductor industry.

As will be appreciated by those skilled in the art, most solders do not adhere well to silicon, which is most commonly used in semiconductor devices. Accordingly, to improve adhesion of the solder 108 to the flip chip die 100, the die 100 may be coated with one or more intermediate die attach layers. The intermediate die attach layers are designed to improve the adhesion between the solder and the semiconductor material in the die, as well as (when necessary) prevent contamination of the semiconductor material. Of course the nature of the intermediate layer or layers will depend to a great extent on the solder material used. By way of one example illustrated in FIG. 4 and described in more detail below, the intermediate layers may include a solderable metallic layer 110 and a metallic barrier layer 112. By way of another example, when a soft solder die attach process using a tin-silver-chromium solder is used, it may be possible to eliminate the intermediate layers.

The flip chip die 100 may be mounted directly on a printed circuit board for use in a system or it may further packaged by mounted it on an appropriate substrate. Referring back to FIG. 3, in the embodiment shown, the flip chip die 100 is mounted on a dedicated grid array substrate 115 (such as a ball or pin grid array substrate) in a conventional manner. Specifically, the die 100 has a plurality of I/O pads/contacts 117 on its active surface. The structure of the die contacts 117 may be widely varied in any conventional manner. For example, conventional die bond pads may be used; the bond pads on the die may be built up to form raised contacts; or solder bumps may be attached to the bond pads to form the contacts. The die contacts 117 are arranged to mate with an array of I/O pads/contacts (not shown) on a first surface of the substrate. The substrate I/O pads may take any appropriate form as well. The opposing surface of the substrate 115 has appropriate I/O pads/contacts 119 as well. Again the substrate contacts 119 may take any suitable form as for example balls or pins or landings. In the embodiment shown, the substrate contacts take the form of an array of pins to form a pin grid array device. Of course ball grid array substrates or other suitable substrates may be used as well. Typically, each of the substrate contacts will be electrically coupled to an associated substrate I/O pad on the opposing surface of the substrate.

Figure 4:
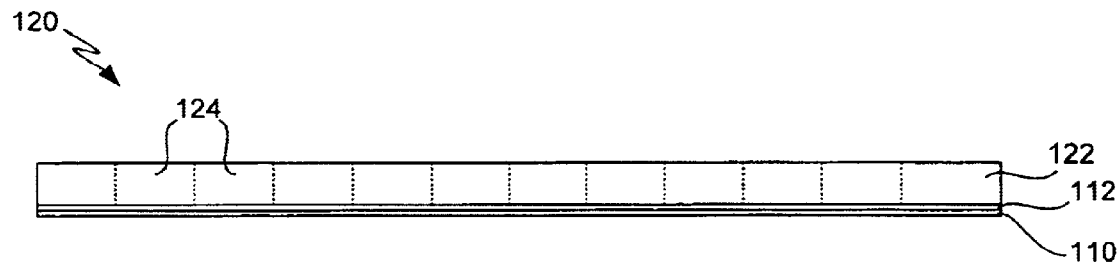
FIG. 4 is a diagrammatic side view of a wafer having its back side coated with a barrier layer and a solderable metallic layer to facilitate the creation of dice suitable for use in the packaging arrangement illustrated in FIG. 3.

Referring next to FIG. 4, a wafer arrangement 120 that includes intermediate die attach layers to facilitate bonding will be described. In the illustrated embodiment, the intermediate layers include barrier layer 112 and solderable metallic layer 110. Both of the intermediate layers may be deposited by any suitable technique such as sputtering or evaporation. The intermediate layers are preferably applied at the wafer stage of processing and before the wafer 120 is diced.

The primary function of the solderable metallic layer is to provide a good bonding surface for the solder 108. A variety of materials may be used as the solderable layer 110 and the appropriate material for a particular application will depend in part on the type of solder used. By way of example, suitable materials for the solderable metallic layer 110 include copper, silver and gold. As will be appreciated by those skilled in the art,.many metals that form good solderable layers (such as copper) have a high mobility and would contaminate the semiconductor material in an undesirable way if applied directly to silicon. Thus the metallic barrier layer 108 is deposited between the silicon 122 and the solderable layer 110 to prevent such contamination. A variety of materials may be used as the barrier layer 112 and the appropriate material for a particular application will depend in part on the material used in the solderable layer. By way of example, suitable materials for the barrier layer 112 include Nickel, Nickel based alloys, Chromium and Chromium based alloys.

In alternative embodiments, a metallic "adhesive" layer could be used either in place of or in addition to the barrier layer. The adhesive layer can be formed out of a metal material that bonds relatively better with the semiconducting material. Such an arrangement would better adhere the barrier layer or the solderable layer to the silicon (or other semiconducting material). Of course in still other embodiments, the solderable metallic layer can be directly applied to the semiconducting material.

Figure 5:
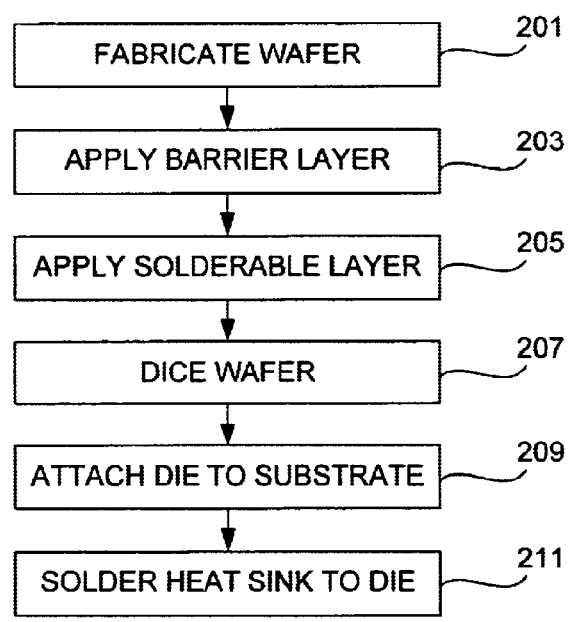
FIG. 5 is a flow chart illustrating a method of packaging an integrated circuit in accordance with one embodiment of the present invention.

Referring next to FIG. 5 in conjunction with FIGS. 3 and 4, a method suitable for fabricating and packaging the described semiconductor devices will be explained. Initially, in step 201, a wafer having a multiplicity of flip chip type integrated circuits 124 formed therein is fabricate in accordance with conventional techniques. Then in step 203 the barrier layer 112 is applied to the back surface of the wafer 122 using conventional techniques such as evaporation or sputtering. After the barrier layer 112 has been applied, the solderable layer 110 is applied over the barrier layer in step 205. Again the deposition of the solderable layer may be performed by conventional deposition techniques such as sputtering or evaporation. After the solderable layer has been applied, the wafer is diced in step 207 in a conventional manner.

A singulated die 100 is then attached to its associated substrate 115 in step 209 using a conventional flip chip attachment process which electrically connects the die contacts 117 to their associated substrate I/O pads (not shown) on the first surface of the substrate. The heat sink is then soldered to the back surface of singulated die 100 in step 211 to complete the process. Of course, the order of many of the described steps can rearranged somewhat without detracting from the invention and in many implementations certain of the described steps may be eliminated and/or other steps added. By way of example, more or less intermediate layers may be applied to the back surface of the wafer as described above. Additionally, the order of the attachment of the die to the substrate and heat conductor may be reversed In the description above, it has been assumed that the heat sink is formed from a material that is suitable for soldering. However, as will be appreciated by those skilled in the art, many existing heat sinks are formed from anodized aluminum which is not particularly well suited for soldering. Therefore, some though must be given to selecting an appropriate heat sink for use in conjunction with the invention. One suitable approach is to form the heat sink from a wettable material such as anodized 6061 aluminum. Alternatively it may be desirable to plate the heat sink with an appropriate wettable material.

Although only a few embodiments of the present invention have been described, it should be understood that the present invention may be embodied in many other specific forms without departing from the spirit or scope of the invention. For example, the materials used as the intermediate die attach layers may be widely varied in accordance with the needs of a particular design. Similarly, the nature of the flip chip type die and the heat sink may be widely varied without departing from the spirit of the invention. Further, although the invention has been described in the context of a flip chip die, it should be appreciated that the term is used in a broad sense to refer to any die having contacts thereon that are intended to mate directly with contacts on an appropriate substrate or device, regardless of whether the die is incorporated in a larger module such as a multi-chip module that would not in and of itself be considered a flip chip device. Therefore, the present examples are to be considered as illustrative and not restrictive, and the invention is not to be limited to the details given herein, but may be modified within the scope of the appended claims.

What is claimed is:

1. A method of packaging integrated circuits comprising:

forming a multiplicity of dice in a semiconductor wafer, the wafer having an active surface having a multiplicity of die contacts formed therein;

depositing a barrier layer on a back surface of the wafer;

depositing a metallic layer over the barrier layer;

dicing the wafer to provide a plurality of singulated dice, wherein the metallic layer on the back side of each die forms a solderable surface and each die has a plurality of associated die contacts on a front surface;

soldering the solderable die surface on the back surface of a selected die to a metallic heat sink using a metallic solder material to provide good thermal conductivity between the selected die and the heat sink.

2. A method of packaging integrated circuits comprising:

providing a die having front and back surfaces, a multiplicity of die contacts arranged on the front surface of the die, a barrier layer deposited on the back surface of the die and a metallic layer deposited on the barrier layer to form a solderable die surface;

soldering the solderable die surface on the back surface of the die to a metallic heat sink using a metallic solder material to provide good thermal conductivity between the die and the heat sink; and attaching the die to a substrate using a flip chip mounting technique wherein the die contacts are directly coupled to an array of contacts located on the substrate.

* * * * *